US009285610B2

(12) United States Patent
Mandelbaum et al.

(10) Patent No.: US 9,285,610 B2
(45) Date of Patent: Mar. 15, 2016

(54) NANOSTRUCTURE HAVING METAL NANOPARTICLES AND A METHOD OF ASSEMBLY THEREOF

(71) Applicant: BAE Systems Information and Electronic Systems Integration Inc., Nashua, NH (US)

(72) Inventors: Idan Mandelbaum, Columbia, MD (US); Tadd C. Kippeny, Mount Airy, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 174 days.

(21) Appl. No.: 13/959,130

(22) Filed: Aug. 5, 2013

(65) Prior Publication Data
US 2014/0042376 A1 Feb. 13, 2014

Related U.S. Application Data

(63) Continuation-in-part of application No. 12/379,930, filed on Mar. 4, 2009, now abandoned.

(51) Int. Cl.
| H01B 1/02 | (2006.01) |
| B82Y 30/00 | (2011.01) |
| G02F 1/00 | (2006.01) |
| B22F 1/00 | (2006.01) |
| B22F 1/02 | (2006.01) |
| H01L 29/06 | (2006.01) |

(Continued)

(52) U.S. Cl.
CPC ............ *G02F 1/0018* (2013.01); *B22F 1/0018* (2013.01); *B22F 1/0059* (2013.01); *B22F 1/0096* (2013.01); *B22F 1/02* (2013.01); *H01B 1/02* (2013.01); *H01L 29/0665* (2013.01); *B22F 2998/00* (2013.01); *B22F 2999/00* (2013.01); *B82Y 10/00* (2013.01); *B82Y 30/00* (2013.01); *B82Y 40/00* (2013.01); *Y10S 977/774* (2013.01); *Y10S 977/882* (2013.01); *Y10S 977/948* (2013.01)

(58) Field of Classification Search
CPC ............. H01B 1/00; H01B 1/02; H01B 1/06; H01B 1/20; B82Y 30/00; B82Y 40/00; C09D 7/1266; C09D 7/1275; C09D 7/1291
See application file for complete search history.

(56) References Cited

U.S. PATENT DOCUMENTS

| 6,548,168 | B1 | 4/2003 | Mulvaney et al. | |
| 8,080,183 | B2 * | 12/2011 | Kotov | B82Y 15/00 252/512 |
| 8,778,227 | B2 * | 7/2014 | Mataki | C07F 5/003 252/301.4 F |

(Continued)

OTHER PUBLICATIONS

B.V. Enustun et al., "Coagulation of Colloidal Gold," J. Am. Chem. Soc., vol. 85, p. 3317-3328, 1963.

(Continued)

*Primary Examiner* — Mark Kopec
(74) *Attorney, Agent, or Firm* — Daniel J. Long

(57) ABSTRACT

A nanostructure and method for assembly thereof are disclosed. The nanostructure includes a gain medium nanoparticle; an output coupler nanoparticle being discrete from and linked to the gain medium nanoparticle; and a plurality of metal nanoparticles being linked about the gain medium nanoparticle, wherein the gain medium nanoparticle and the output coupler nanoparticle are included in the nanostructure in a one to one ratio.

24 Claims, 9 Drawing Sheets

(51) Int. Cl.
    *B82Y 40/00* (2011.01)
    *B82Y 10/00* (2011.01)

(56) References Cited

U.S. PATENT DOCUMENTS

| | | | |
|---|---|---|---|
| 8,926,871 B2* | 1/2015 | Lim | H01L 31/02167 136/252 |
| 2006/0183247 A1 | 8/2006 | Kim et al. | |
| 2007/0154881 A1 | 7/2007 | Koo | |
| 2008/0085088 A1 | 4/2008 | Lin et al. | |
| 2010/0217024 A1 | 8/2010 | Mandelbaum et al. | |

OTHER PUBLICATIONS

T. Kippeny, "Exciton Dynamics in Cadmium Selenide/Zinc Selenide Core/Core-Shell Nanocrystals as Effected by Surface Ligands Modification Using Femtosecond Fluorescence Upconversion," Dissertation, Vanderbilt University, 2005.

S.K. Park, et al., "Preparation of silica nanoparticles: determination of the optimal synthesis conditions for small and uniform particles," Colloids and Surfaces A: Physicochemical and Engineering Aspects, vol. 197, Issues 1-3, 4, Feb. 2002, pp. 7-17.

L.M. Liz-Marzan, et al. in "Synthesis of Nanosized Gold-Silica Core-Shell Particles" (Langmuir, vol. 12, 4329-4335, 1996.

Bai et al., "A Spectrum-Narrowed, Wavelength and Temperature Stabilized Broad Area Laser Using a Subwavelength Resonant Grating Filter Feedback" The 19th Annual Meeting of the IEEE LEOS (LEOS'06), Montreal Canada, (2006), pp. 659-660.

Bjork et al., "Definition of a Laser Threshold" Physical Review A, (1994), vol. 50, No. 2, pp. 1675-1680.

Chu, "Physical Limitations of Omni-Directional Antennas" Journal of Applied Physics, (1948), vol. 19, pp. 1163-1175.

Citrin, "Coherent Excitation Transport in Metal-Nanoparticle Chains" Nano Letters, (2004), vol. 4, No. 9, pp. 1562-1565.

Citrin, "Subwavelength Nanoplasmonic Ring Resonators" J. Opt. Soc. Am. B, (2005), vol. 22, No. 8, pp. 1763-1769.

Citrin, "Plasmon-Polariton Transport in Metal-Nanoparticle Chains Embedded in a Gain Medium" Optics Letters, (2006), vol. 31, No. 1, pp. 98-100.

Govorov et al., "Exciton-Plasmon Interaction and Hybrid Exctions in Semiconductor-Metal Nanoparticle Assemblies" Nano Letters, (2006), vol. 6, No. 5, pp. 984-994.

Gradecak et al., "GaN Nanowire Lasers with Low Lasing Thresholds" Applied Physics Letters, (2005), vol. 87, pp. 173111-1 to 173111-3.

Hsung et al., "Thiophenol Protecting Groups for the Palladium-Catalyzed Heck Reaction: Efficient Syntheses of Conjugated Arylthiols" Tetrahedron Letters, (1995), vol. 36, No. 26, pp. 4525-4528.

Hsung et al., "Synthesis and Characterization of Unsymmetric Ferrocene-Terminated Phenylethynyl Oligomers Cp2Fe-[C=C—C6H4]n—X (X=Sh, SMe, and SO2Me)" Organometallics, (1995), vol. 14, pp. 4808-4815.

Kneipp et al., "Surface-Enhanced Raman Scattering and Biophysics" Journal of Physics: Condensed Matter, (2002), vol. 14, pp. R597-R624.

Lavastre et al., "Selective and Efficient Access to Ortho, Meta and Para Ring-Substituted Phenylacetylene Derivatives R-[C=C—C6H4]x-Y (Y: H, No2, CN, I, NH2)" Tetrahedron, (1997), vol. 53, No. 22, pp. 7595-7604.

Lee et al., "Bioconjugated Ag Nanoparticles and CdTe Nanowires: Metamaterials with Field-Enhanced Light Absorption" Angewandte Chemie Int. Ed., (2006), vol. 45, pp. 4819-4823.

Lu et al., "Self-Similar Chain of Metal Nanospheres as Efficient Nanolens" Phys. Rev. Lett., (2003), vol. 91, No. 22, pp. 227402.

Lu et al., "Lasing of CdSexS1-x Quantum Dots in a Glass Spherical Microcavity" Journal of Physics: Condensed Matter, (2002), vol. 14, pp. 6395-6401.

Murray et al., "Synthesis and Characterization of Monodisperse Nanocrystal and Close-Packed Nanocrystal Assemblies" Annu. Rev. Mater. Sci., (2000), vol. 30, pp. 545-610.

Peng et al., "Epitaxial Growth of Highly Luminescent CdSe/CdS Core/Shell Nanocrystals with Photostability and Electronic Accessibility" J. Am. Chem. Soc. (1997), vol. 119, pp. 7019-7029.

Slocik et al., "Optical Characterization of Bio-Assembled Hybrid Nanostructures" Supramolecular Chemistry, (2006), vol. 18, No. 5, pp. 415-421.

Stober et al., "Controlled Growth of Monodisperse Silica Spheres in the micron Size Range" Journal of Colloid and Interface Science, (1968), vol. 26, pp. 62-69.

Stuczynski et al., "Formation of Metal-Chalcogen Bonds by the Reaction of Metal Alkyls with Silyl Chalcogenides" Inorganic Chemistry, (1989), vol. 28, No. 25, pp. 4431-4432.

Zhang et al., "Fabrication of InAs Quantum dots in AlAs/GaAs DBR Pillar Microcavities for Single Photon Sources" Journal of Applied Physics, (2005), vol. 97, pp. 073507-1 to 073507-7.

Zhu et al., "Facile One-Pot Synthesis of Gold Nanoparticles Stabilized with Bifunctional Amino/Siloxy Ligands" Journal of Colloid and Interface Science, (2005), vol. 287, pp. 360-365.

Kim et al., "Nanoparticle Probes with Surface Enhanced Raman Spectroscopic Tags for Cellular Cancer Targeting" Analytical Chemistry, Oct. 1, 2006, vol. 78, No. 19, pp. 6967-6973.

Nann et al., "Single Quantum Dots in Spherical Silica Particles" Angew. Chem. Int. Ed., 2004, vol. 43, pp. 5393-5396.

Duarte, F.J. James, R.O., "Tunable solid-state lasers incorporating dye-doped, polymer-nanoparticle gain media." Optics Letters 28.21 (2003): 2088-2090.

* cited by examiner

NANOSTRUCTURE HAVING METAL NANOPARTICLES AND A METHOD OF ASSEMBLY THEREOF

CROSS-REFERENCE TO RELATED APPLICATION

This application is a CIP of Ser. No. 12/379,930 (filed Mar. 04, 2009, now ABN).

FIELD

The present application relates to nanostructures. More particularly, the application relates to metal nanoparticles and methods of assembling nanostructures including metal nanoparticles.

BACKGROUND

Gold metal nanoparticles have been used as a pigment to, for example, stain glass. More recently, there has been research into developing metal nanostructure assemblies, including structures made from noble metals such as gold and silver. For example, it is known to use an electromagnetic wave to excite a strong resonance condition in metal nanoparticle assemblies, which can lead to enhanced, localized electromagnetic fields.

SUMMARY

A nanostructure is disclosed which includes a gain medium nanoparticle; an output coupler nanoparticle being discrete from and linked to the gain medium nanoparticle; and a plurality of metal nanoparticles being linked about the gain medium nanoparticle, wherein the gain medium nanoparticle and the output coupler nanoparticle are included in the nanostructure in a one to one ratio.

An exemplary method is also disclosed for assembling an exemplary nanostructure. The method includes attaching a first linker to a gain medium nanoparticle; attaching the first linker to a substrate larger than the gain medium nanoparticle; attaching a plurality of second linkers to the gain medium nanoparticle; detaching the first linker connected to the gain medium nanoparticle from the substrate; attaching a plurality of third linkers to an output coupler nanoparticle; attaching the first linker to one of the plurality of third linkers; attaching a plurality of fourth linkers to a plurality of metal nanoparticles; and attaching each of the plurality of second linkers to each of the plurality of fourth linkers.

BRIEF DESCRIPTION OF TOE DRAWINGS

The accompanying drawings, which are included to provide a further understanding of the invention and are incorporated in and constitute a part of this specification, illustrate embodiments of the invention that together with the description serve to explain the principles of the invention. In the drawings.

FIGS. 5A-D show exemplary linker types used to assemble nanostructures.

Figure 6A:
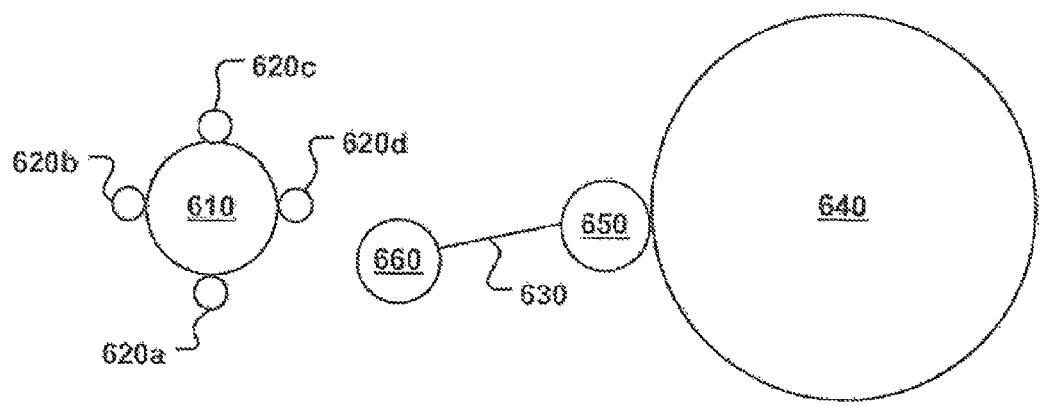
Figure 6B:
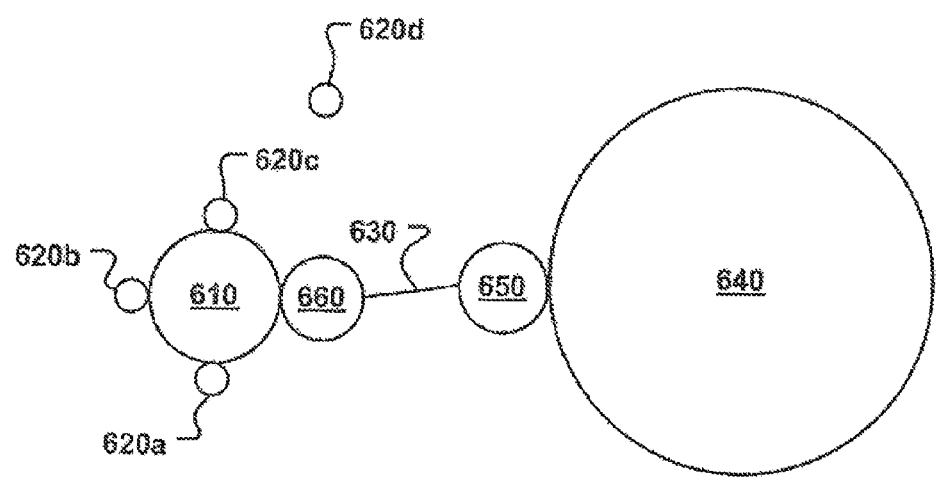

FIGS. 6A and 6B are high level diagrams showing an exemplary gain medium nanoparticle and an exemplary first linker temporarily connecting to a larger substrate.

Figure 7A:
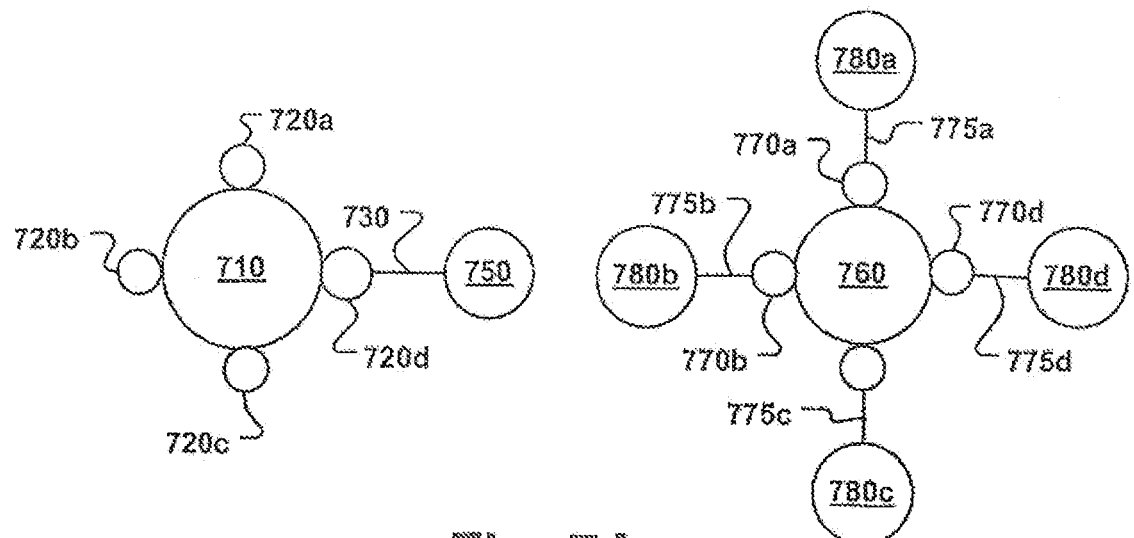
Figure 7B:
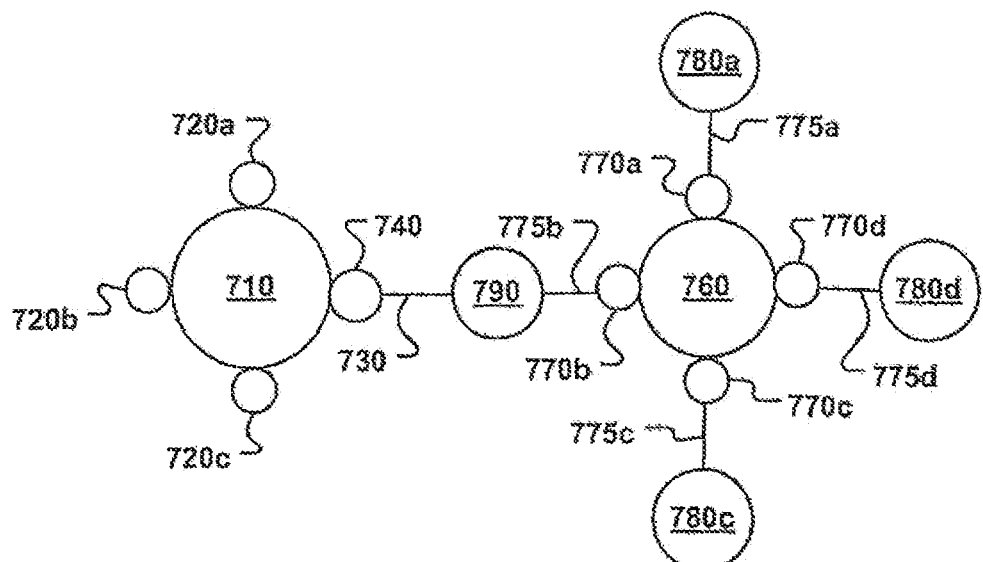

FIGS. 7A and 7B are high level diagrams showing an exemplary method of connecting a gain medium nanoparticle and an output coupler nanoparticle.

Figure 8A:
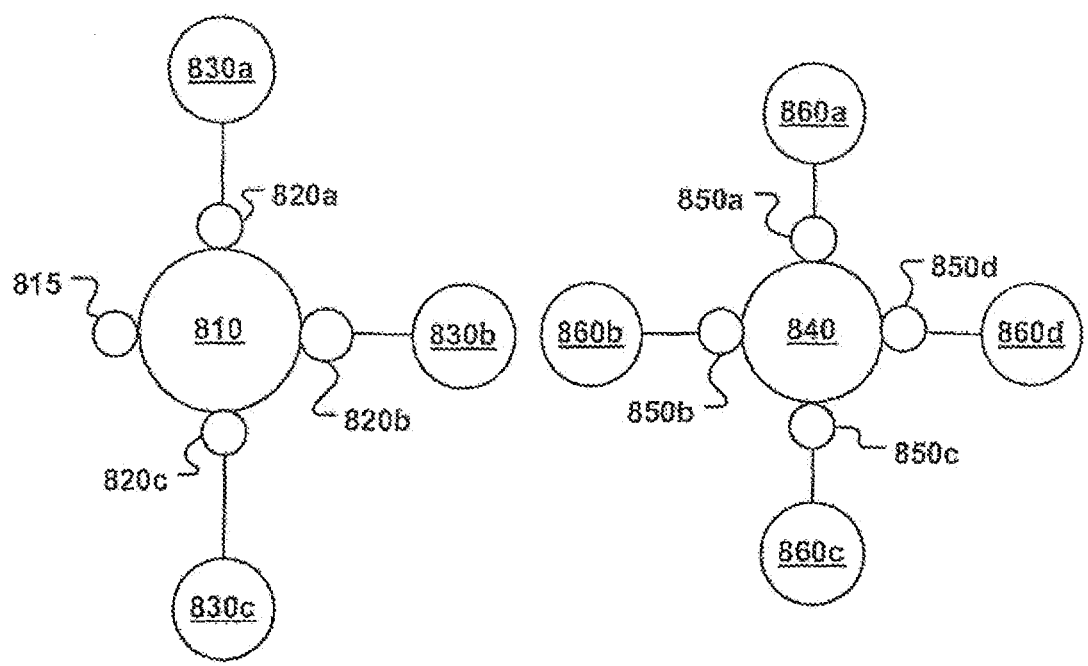
Figure 8B:
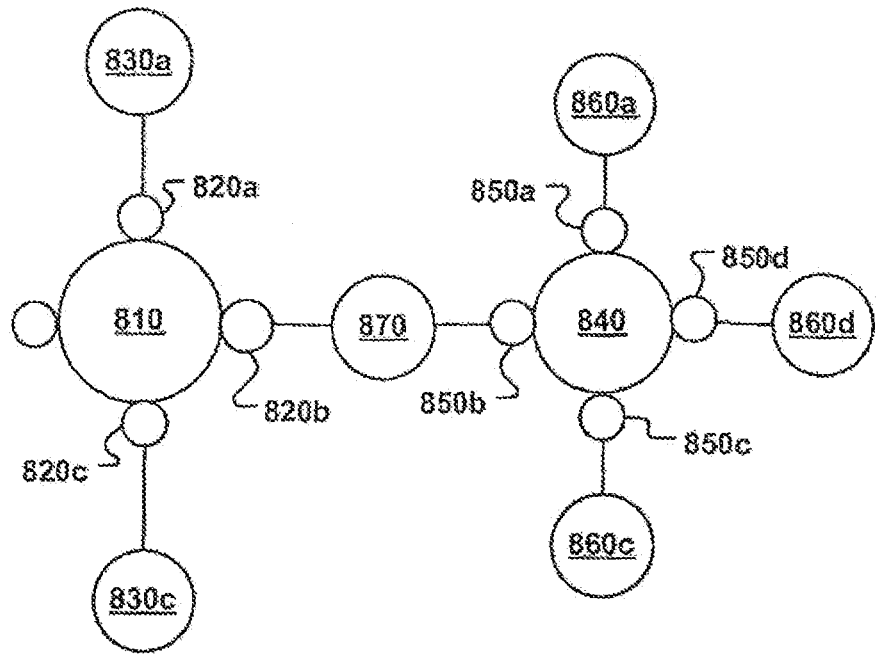

FIGS. 8A and 8B are high level diagrams showing an exemplary method of connecting a gain medium nanoparticle and a tier of metal nanoparticles.

Figure 9:
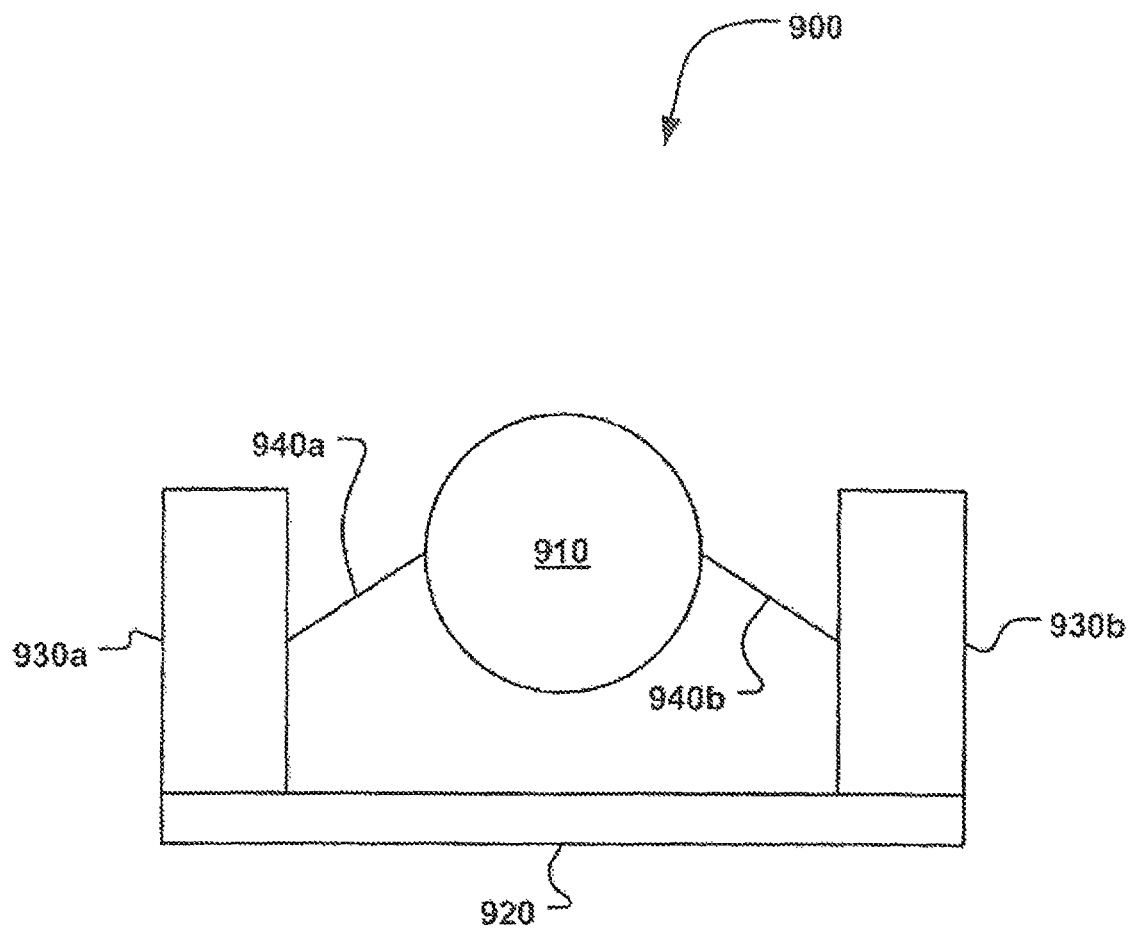

FIG. 9 is a high level diagram of an exemplary injection structure.

Figure 10:
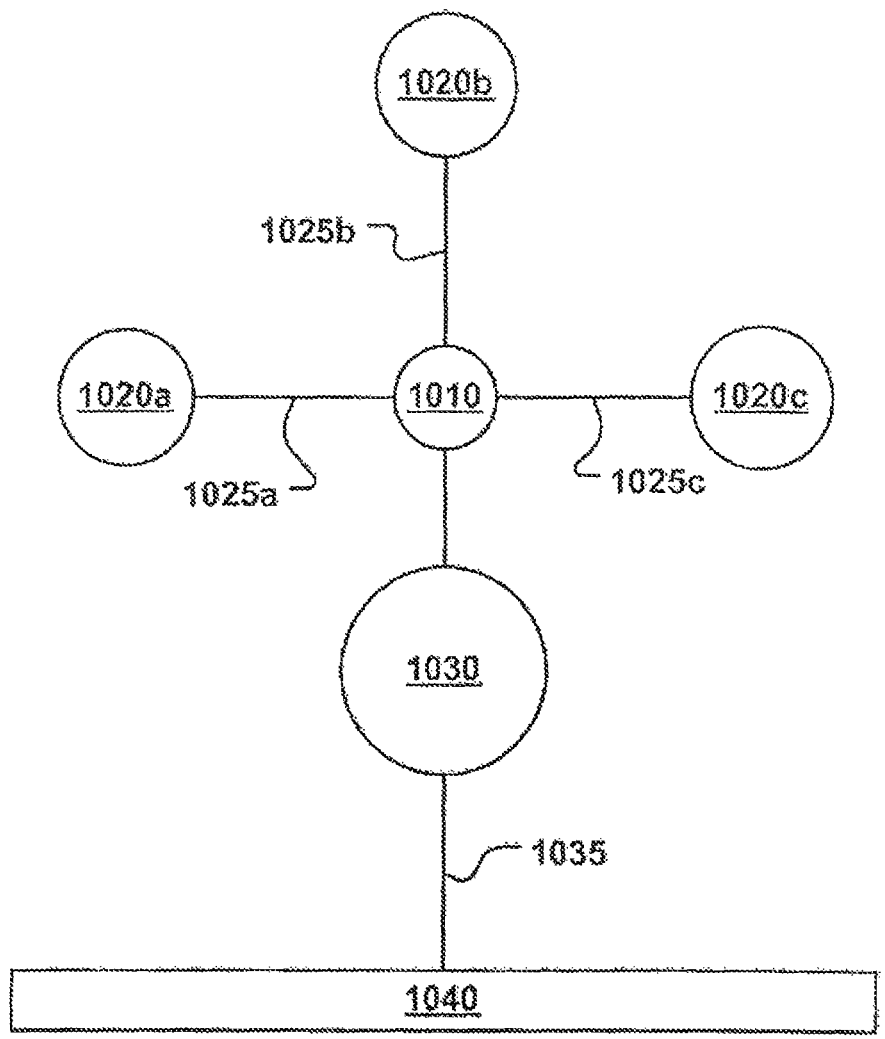

FIG. 10 is a diagram of an exemplary nanostructure anchored to a substrate.

DETAILED DESCRIPTION

Figure 1:
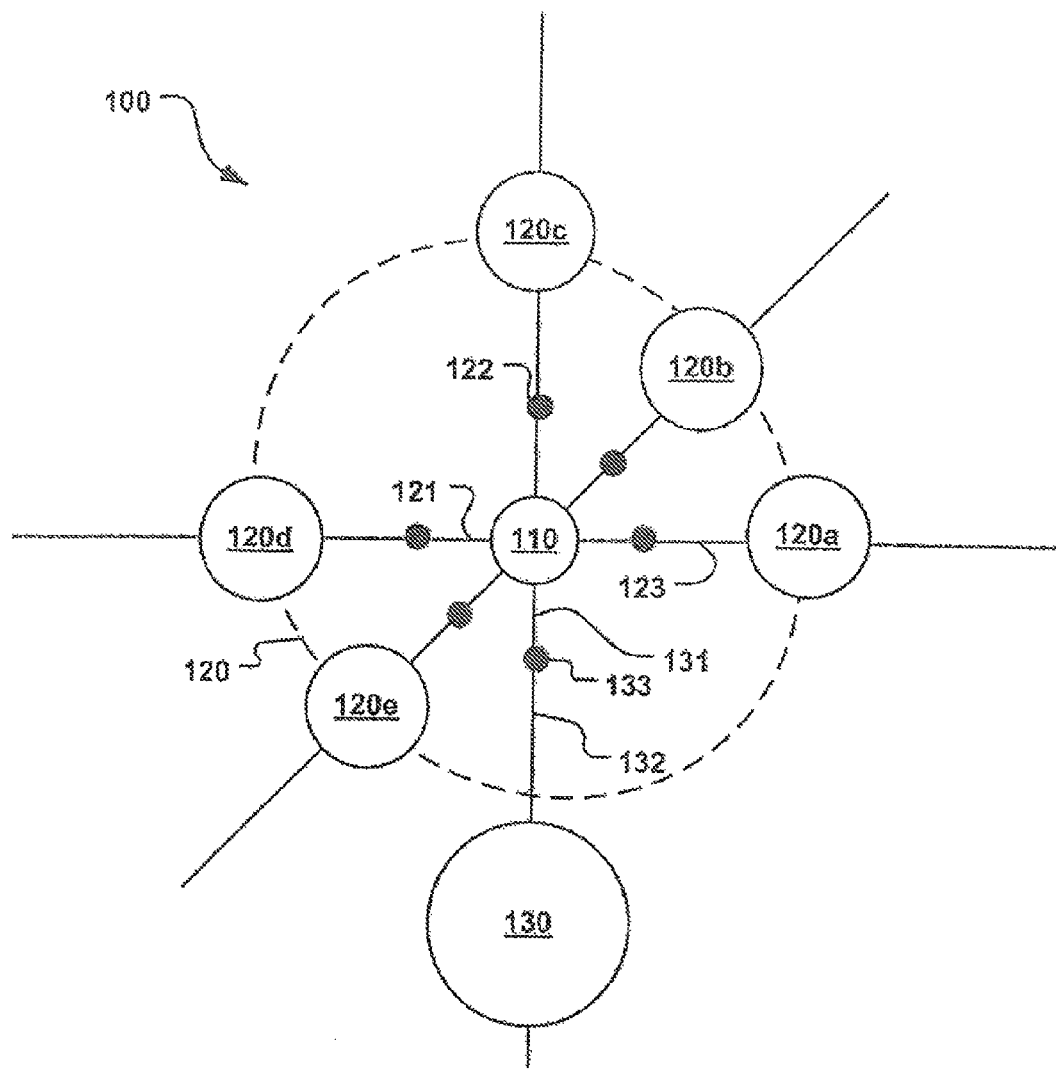
FIG. 1 is a diagram of an exemplary nanostructure including a single tier of metal nanoparticles.

FIG. 1 is a diagram of an exemplary nanostructure 100. The nanostructure 100 includes a gain medium nanoparticle 110, and an output coupler nanoparticle 130, at a one to one ratio, linked about the gain medium nanoparticle. A plurality of metal nanoparticles 120a to 120e is linked about the gain medium nanoparticle.

A spherical metal nanoparticle in free space can act as a resonator with a frequency peak at the wavelength where the real part of the dielectric constant is negative. The resonant electromagnetic behavior is a result of confinement of conduction electrons to the small metal nanoparticle volume, where dimensions are much smaller than a wavelength of an excitation electromagnetic wave. This is sometimes called the plasmonic resonance. The plasmonic resonance condition may be a function of a dielectric constant of the environment surrounding the nanostructures and can cause high local field intensities. By arranging multiple nanoparticles in certain geometries that tend to focus the field, large localized field enhancements can be provided. When a nanoparticle arrangement creates a resonance cavity, it can have the effect of increasing the system Q beyond that of individual nanoparticles.

Embodiments of a nanostructure include at least one metal nanoparticle tier that can confine approaching light in almost any direction and excite surface plasmons. These plasmons, in turn, can produce a focused electric field (i.e., electromagnetic enhancement) in a resonance cavity having the at least one tier of metal nanoparticles.

In the exemplary nanostructure 100 of FIG. 1, a first metal nanoparticle tier 120 includes the metal nanoparticles 120a to 120e and the output coupler nanoparticle 130. Each metal nanoparticle 120a to 120e of the first tier may be linked about the gain medium nanoparticle 110 (e.g., attached to the gain medium nanoparticle). The output coupler nanoparticle 130 may also be linked to the gain medium nanoparticle 110 in a one to one ratio.

The tier 120 of metal nanoparticles 120a to 120e shown in FIG. 1 can act as a three-dimensional feedback structure or resonance cavity that amplifies the electric field within the resonance cavity via the electromagnetic enhancement. The enhanced field can be highly localized at a place serving as a "hot spot" of field enhancement and a site for locating a material desired to be subject to the enhanced field, such as the gain medium nanoparticle 110.

Metal nanoparticles 120a to 120e can be, for example, any kind of metal nanoparticle assembly that has a dielectric constant having a negative real part. Examples of metal nanoparticles for the metal nanoparticle assemblies may include gold, silver, aluminum, copper, titanium, chromium, and other metals capable of supporting surface plasmons. The metal nanoparticles 120a to 120e can be on the order of 15 nanometers, for example, although larger or smaller nanoparticles may be used to construct the nanostructure 100. Metal nanoparticles currently are available in a number of different types and sizes from a commercial source, such as Sigma Aldrich™ or Ted Pella, Inc., or they can be prepared using known methods. For example, a colloidal formation method of preparing metal nanoparticles is described by B. V. Enüstün et al. in "Coagulation of Colloidal Gold" (*J. Am. Chem. Soc.*, 85, 3317 (1963)).

In FIG. 1, the exemplary nanostructure 100 has a somewhat centrally located nanoparticle 110. This nanoparticle serves as a gain medium for the nanostructure, capable of producing a stimulated emission of energy. The gain medium nanoparticle 110 can comprise a photocatalytic material that is capable of generating electrons and holes, or electron-hole pairs such as excitons, which may combine to generate photons. This material may be a semiconductor material or any other desired material to be exposed to an enhanced field. For example, gain medium nanoparticle 110 may be a light-emitting semiconductor material, such as II-VI or III-V semiconductor material, for example CdSe, GaAs, InSb, or $LiNbO_3$, or other types of semiconductor materials. A semiconductor nanoparticle can replicate the characteristics of bulk semiconductors on a scale of a few nm (e.g. 1-100 nm), and is sometimes referred to herein as a quantum dot or a nanocrystal. Semiconductor nanoparticles are available in a variety of types, sizes, and shapes.

While embodiments are described herein including a photocatalytic material as a gain medium material nanoparticle 100, it is to be understood that the gain medium can comprise another kind of material, such as a dielectric material. For example, the gain medium can include nonlinear BZN dielectric ceramics or other linear or nonlinear dielectric material. For example, embodiments using nonlinear material as the gain medium can enable high speed electro-optical interaction capabilities. For instance, the field enhancement mechanism can act on the nonlinear material to give it a much higher effectively nonlinearity. This can enable devices such as high speed electro-optical switches, routers, and wavelength converters with a very small form factor. Additionally, embodiments may use field tunable nonlinear dielectric material (e.g., BZN) to control the enhancement strength and peak wavelength.

Embodiments can include a magnetic nanoparticle material, such as fine ferromagnetic particles of iron ferrite, or other kinds of material that are responsive to a magnetic field, as the gain medium to which the first tier 120 of metal nanoparticles 120a to 120e is attached.

Embodiments can include a nanoparticle that does not need to interact with the surrounding feedback structure and which can even be removed, if desired. For example, a "placeholder" nanoparticle may be provided to build a metal nanoparticle assembly and thereafter removed. The size of such a placeholder nanoparticle may be of the order of 1 nm, for example, although a placeholder nanoparticle can be larger or smaller than 1 nm.

The gain medium nanoparticle 110 also can be a semiconductor nanoparticle covered with a shell layer of another material, such as a wider bandgap semiconductor material to form a core-shell heterostructure. A heterostructure can affect (e.g., minimize) the number of surface traps, yield greater charge recombination (quantum yield), reduce leakage current, and improve injection characteristics. An exemplary heterostructure may be synthesized with less than five percent wavelength polydispersity (e.g., see T. Kippeny, "Exciton Dynamics in Cadmium Selenide/Zinc Selenide Core/Core-Shell Nanocrystals as Effected by Surface Ligands Modification Using Femtosecond Fluorescence Upconversion").

For example, a CdSe semiconductor nanoparticle can serve as the core and a ZnS epitaxial layer can function as the shell, although other semiconductor material types may be used to form the heterostructure. The zinc sulfide shell can be applied by making a reaction solution of 50/50 molar of 0.5 M zinc naphthenate mixed with 8 M sulfur in dibutylether (DBE) diluted to 0.5 M with toluene. This reaction solution can then be heated to 200° C., and added dropwise to the CdSe core nanoparticles. As shell growth proceeds (e.g., as reagent solution is added dropwise), the emission increases until maximum amplitude is observed. The emission peak blue-shifts slightly and then red-shifts as reagent addition is continued. Addition of shelling reagent is halted when the emission peak red-shifts to the original core emission wavelength. This results in between 6 to 8 monolayers of ZnS shell for each core-shell nanoparticle heterostructure.

The output coupler nanoparticle 130 can be used for directing an emission from the nanostructure 100 produced by the gain medium nanoparticle 110. The output coupler nanoparticle can also be used as an anchor for linking the nanostructure 100 to a substrate. The output coupler nanoparticle 130 can take the place of a traditional output coupler, which typically would be a semitransparent dielectric, (e.g., a mirror used in a laser resonator). The output coupler nanoparticle 130 can enable photons to be ejected collinearly by providing a mechanism for the nanostructure to be directionally aligned as well as a way in which the photons may be outputted. The output coupler should occur at a one to one ratio with the gain medium nanoparticle.

The output coupler nanoparticle 130 can comprise a material such as silicon dioxide, for example, or any other type of material which can serve as a "defect" in the resonance cavity that directs the emission of excitons produced by the gain medium nanoparticle 110. For example, output coupler 130 can comprise silicon carbide (SiC), silicon (Si) or germanium (Ge) for wavelengths in the infrared range, or sapphire for wavelengths in the visible light range. Synthesis of silicon dioxide nanoparticles is known and can be accomplished by hydroyzing tetraethylortho-silicate (TEOS) in water, ammonia, and ethanol. For example, varying the water/TEOS ratio, the concentration of ammonia, the feed rate of the reactant, and the temperature, silica nanoparticles can be provided that range in size from 10 to 350 nanometers (e.g., see S. K. Park, et al., "Preparation of silica nanoparticles: determination of the optimal synthesis conditions for small and uniform particles").

Referring to FIG. 1, the gain medium nanoparticle 110, the metal nanoparticles 120a to 120f, and the output coupler nanoparticle 130 can be linked using organic linkers. A first linker 121, a second linker 122, and a connection point 123 between the first and second linkers, are provided between the gain medium nanoparticle 110 and each metal nanoparticle of tier 120. A third linker 131, a fourth linker 132, and a connection point 133 between the third and fourth linkers are provided between the gain medium nanoparticle 110 and the output coupler nanoparticle 130. The linkers connecting the gain medium nanoparticle 110, the tier of metal nanoparticles 120, and the output coupler nanoparticle 130 can be any organic ligand type, such as alkane linkers or polyethylene glycol (PEG) linkers, or another type of linker comprised of organic material.

Figure 2:
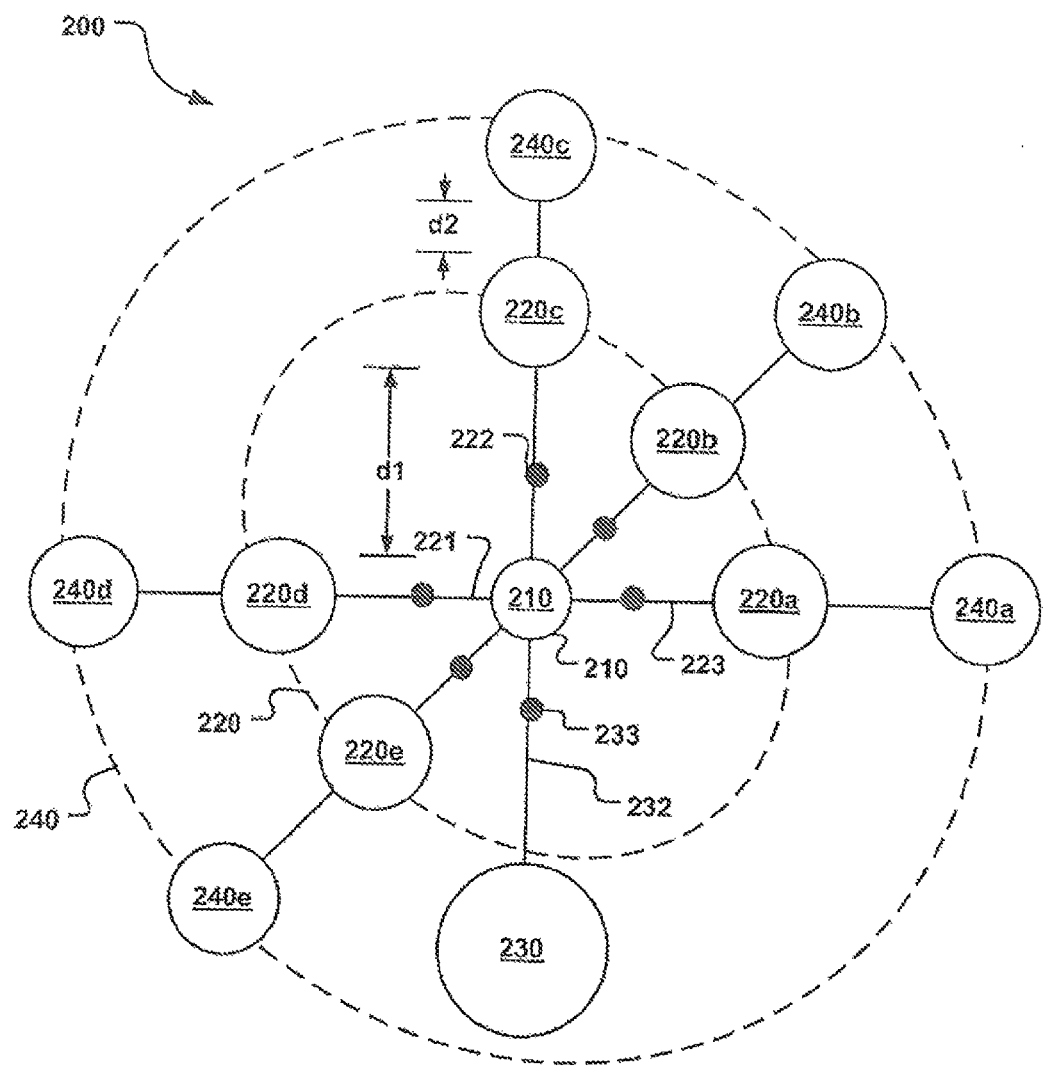
FIG. 2 is a diagram of an exemplary nanostructure including two tiers of metal nanoparticles.

FIG. 2 is a diagram of an exemplary nanostructure 200 with a first tier 220 of metal nanoparticles 220a to 220e arranged about a gain medium nanoparticle 210 and a second tier 240 of metal nanoparticles 240a to 240e arranged about the first tier 220. By varying the number of tiers of metal nanoparticles, the relative sizes of the metal nanoparticles, and/or the distances between the metal nanoparticles, parameter values can be determined, which allow for extraction of a maximum enhancement from a given nanoparticle configuration.

An exemplary nanostructure embodiment can include a metal nanoparticle and/or gain medium nanoparticle shape chosen to tune the structure to a particular resonant wavelength. For example, although the nanoparticles shown in FIG. 1 and FIG. 2 are depicted as spheres, the shape of the nanoparticle can be a rod, triangle, plate, pentagon, ellipsoid, or any other desired shape. Other parameters that may be controlled to increase electromagnetic field enhancement include varying the size of a metal nanoparticle and varying the size of metal nanoparticles from one tier group relative to another.

Keeping the distances between the nanoparticles proportional while increasing only the sizes of the nanoparticles can yield a high gain increase that follows a power law with the sizes of the nanoparticles. The non-radiative decay rate does not necessarily increase correspondingly. By bringing the nanoparticles closer together for a given nanoparticle diameter set, the enhancement and non-radiative lifetime can, for example, increase exponentially.

The associated wavelength of a gain medium nanoparticle, for example, a semiconductor nanoparticle may be adjusted by, for example, controlling a size (e.g., diameter) or shape of a nanoparticle to tune it to a desired emission or lasing wavelength. For example, a range of wavelengths from 490-620 nm, or lesser or greater, can be achieved for CdSe semiconductor nanocrystals by appropriately varying the diameter of the CdSe nanoparticle. Wider or narrower ranges of wavelengths can be achieved by using other semiconductor material compositions.

While FIG. 1 shows nanostructure 100 as having metal nanoparticles 120a to 120f attached to six "sides" of a gain medium nanoparticle 110, with three orthogonal axes, other embodiments may be arranged on fewer or more axes and utilize a fewer or greater number of metal nanoparticles per nanostructure to focus the field. There may also be a fewer or greater number of nanoparticles per tier. The pattern of the overall nanostructures may be self-similar or any other type of pattern. Embodiments can be configured to include more than one tier of metal nanoparticles to amplify (e.g., increase or decrease (i.e., attenuate)) the electric field within the cavity. There should still exist however, the ratio of one to one between the gain medium nanoparticle 110, and the output coupler 130. Furthermore, some embodiments of nanostructure geometries may include two or more tiers to provide large localized field enhancements. In FIG. 2, a distance d1 between a metal nanoparticle in tier 220 and the gain medium nanoparticle 210, and a distance d2 between a metal nanoparticle in tier 240 and a metal nanoparticle of tier 220 can be set to particular values to control field enhancement. Because the nanostructures 100 or 200 can be assembled to be smaller than the wavelength of light, for example, in sizes on the order of about 100-200 nm, these nanostructures can have a very high packing density that permit their use in a variety of optical applications.

Figure 3:
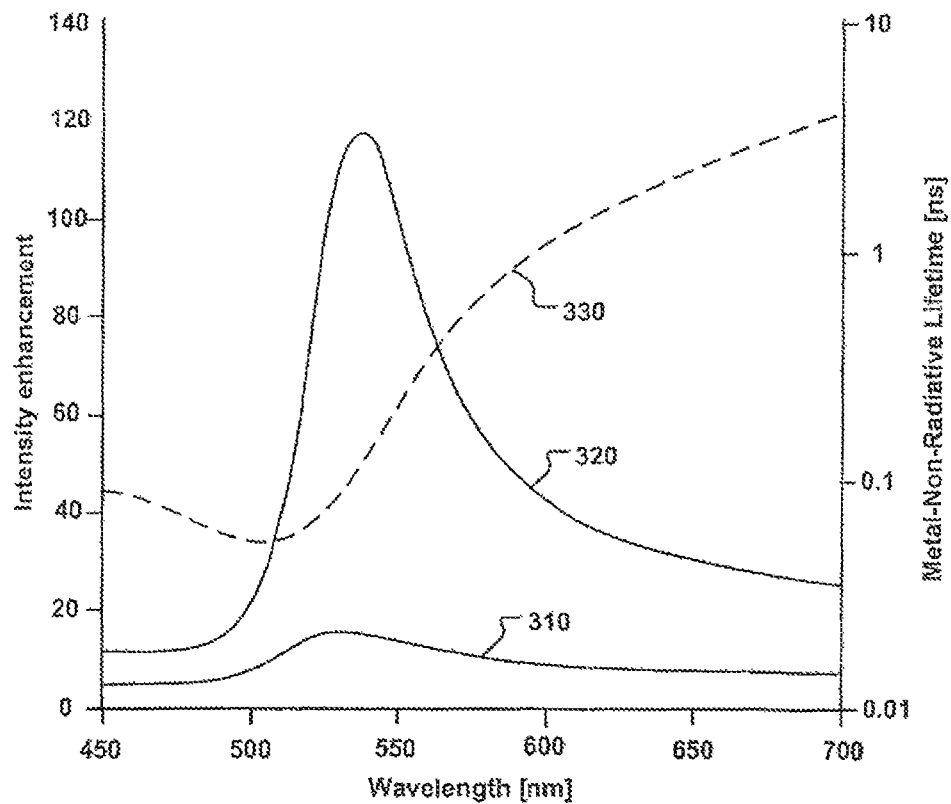
FIG. 3 shows graphs depicting exemplary intensity enhancement and metal non-radiative lifetimes in relation to wavelength for single tier and multi-tier nanostructures.

FIG. 3 describes graphs showing increased enhancement provided by exemplary single tiered and multi-tiered structures. As shown in FIG. 3, the graph 310 represents enhancement provided by a nanostructure having only one tier including two metal nanoparticles around a centrally located nanoparticle, and the graph 320 represents enhancement provided by adding a second tier of metal nanoparticles spaced from, and about a first tier of metal nanoparticles. The second tier provides two additional metal nanoparticles, resulting in a nanostructure with a total of four metal nanoparticles around a centrally located nanoparticle. As can be seen from graph 310, the exemplary nanostructure having only a single metal nanoparticle tier can provide a slight enhancement to the field and has an enhancement peak at about 525 nm. Providing additional metal nanoparticle tiers can increase enhancement intensity. For example, graph 320 shows a substantial increase in enhancement intensity around 530 nm in a nanostructure provided with a second metal nanoparticle tier located a distance further from the first metal nanoparticle tier.

FIG. 3 also includes a graph 330, which represents a metal non-radiative lifetime (i.e., the 8 rate at which the gain medium nanoparticle couples to the non-radiative modes of the metal nanoparticles) resulting from either the one-tier structure corresponding to graph 310 or the two-tier structure corresponding to graph 320. Graph 330 demonstrates a negligible increase in the metal non-radiative lifetime (i.e., the graph of the metal non-radiative lifetime for the one tier structure coincides or overlaps with the graph of the metal non-radiative lifetime for the two tier structure) when a second metal nanoparticle tier is provided to a nanostructure according to embodiments. Hence, the addition of metal nanoparticle tiers can not only increase enhancement intensity, but also can do so with no substantial increase of coupling to the non-radiative lifetime. That is, a significant increase in enhancement can be obtained almost independently of non-radiative loss by optimizing the geometry of the system.

Embodiments can optionally include embedding the nanostructure in a polymer or other type of material that would provide support to the nanostructure. Additionally, this would permit another aspect of tuning because the frequency and intensity of the plasmonic resonance is sensitive to the dielectric properties of the surrounding medium. For example, the plasmonic resonance can be sensitive to a refractive index of matter close to the nanostructure surface.

Figure 4:
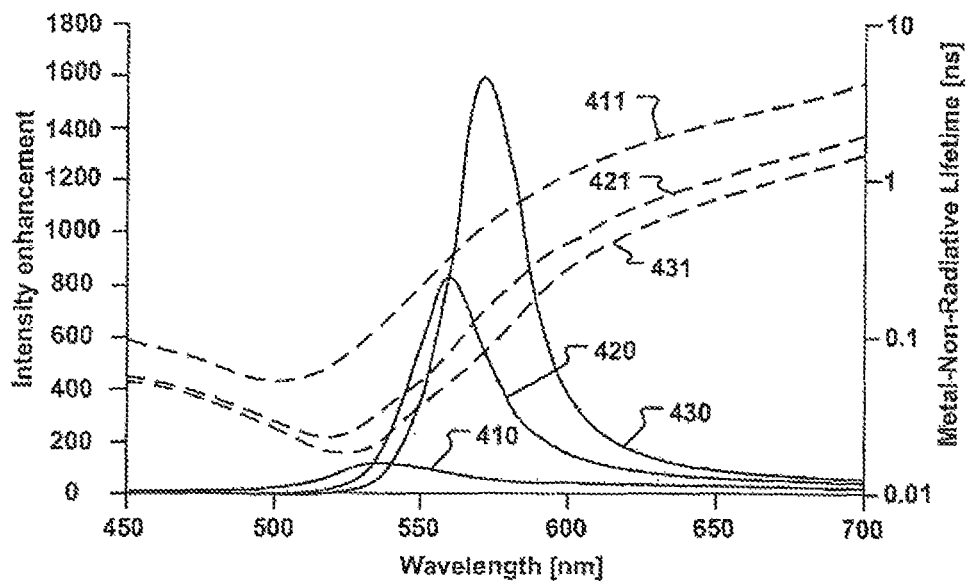
FIG. 4 shows graphs depicting effects of different types of dielectrics on a resonance wavelength of a nanostructure with respect to intensity enhancement and metal non-radiative lifetimes.

FIG. 4 demonstrates the effects a dielectric constant can have on the field enhancement of an exemplary nanostructure and corresponding metal non-radiative lifetime. In FIG. 4, graphs 410, 420, and 430 show enhancements in the structure for surrounding environments of air, glass, and water, respectively. As shown, an increase in the dielectric constant of a material surrounding the nanostructure causes a corresponding increase in the field intensity enhancement and a red-shift of the peak wavelength.

Graphs 411, 421, and 431 of FIG. 4 show the metal non-radiative lifetime corresponding to the non-radiative recombination rate for air, glass, and water, respectively. These graphs demonstrate that the non-radiative lifetime decreases as the dielectric constant of the surrounding material increases. Comparing graphs 410 and 420 with graphs 411 and 421, it can be seen that as the enhancement increases by an order of magnitude between air and glass, the non-radiative decay rate decreases by a factor of about 2. As enhancement grows, the gain medium nanoparticle non-radiative recombination rate into the metal grows as well, but at a rate much smaller than the enhancement growth rate, thus making dielectric shifting an efficient enhancement tuning method. Hence, a dielectric material not only can provide support for a nanostructure, it can also provide a way to fine-tune the enhancement strength and peak wave length of a nanostructure.

Another optional enhancement control variable is the inclusion of a coating on the metal nanoparticles that has a different dielectric constant than the metal. For instance, it is possible to tune the enhancement and/or the resonance wavelength of the nanostructure by changing the surrounding coating material and its corresponding dielectric constant. For example, silica may be provided as a metal nanoparticle coating between 2-4 nanometers thick, although this coating may be have a lesser or greater thickness. The growth of the silica shell as a coating is known, and can be controlled, for example, by the method described by L. M. Liz-Marzán, et al. in "Synthesis of Nanosized Gold-Silica Core-Shell Particles" (*Langmuir,* 12, 4329 (1996)).

Embodiments can include a nanoparticle having non-linear optical properties placed in a location of focused electromagnetic field (i.e., an enhanced field location). This field can act on the nonlinear material, potentially yielding a much higher effective nonlinearity. Such nanoparticle materials may exhibit second or third order non-linearity, and can change the optical properties of these materials as a function of a field in which they are placed. For example, using a non-linear material for the gain medium nanoparticle would permit optic behavior that would normally occur at a high intensity to occur at lower intensity (e.g., an order of magnitude lower). This can substantially increase the potential applications for such a structure, such as more efficient optical switching applications.

A self-assembly method for creating this nanostructure can permit control to be retained over the number of layers, particle material composition, size, shape and/or overall development of the nanostructure. This method can permit the structure to have a self-guided assembly that yields a high volume of product due to the selective nature of self-assembly chemistry (i.e. because each particle can selectively bind to another kind of particle, there can be a high yield of the desired product).

An exemplary method for assembling a nanostructure includes attaching a first linker to a gain medium nanoparticle, and attaching the first linker to a substrate larger than the gain medium nanoparticle. A plurality of second linkers is attached to the gain medium nanoparticle. The first linker connected to the gain medium nanoparticle is detached from the substrate. A plurality of third linkers is attached to an output coupler nanoparticle. The first linker is attached to one of the plurality of third linkers. A plurality of fourth linkers is attached to a plurality of metal nanoparticles. Each of the plurality of second linkers is attached to each of the plurality of fourth linkers.

Embodiments can be carried out by using organic linkers that attach to another kind of linkers but not to themselves. For example, different kinds of organic linkers can be used to assemble the exemplary nanostructure. The terminal groups of the linkers can be, for example, a thiol group for the gain medium nanoparticle binding, a silyl group for the output coupler nanoparticle binding or a carboxyl group for the metal nanoparticle binding. The terminal groups of the linkers can be designed for peptide binding as a mechanism for the overall assembly of exemplary nanostructures. Peptide bonding can occur when a carboxyl group of one molecule reacts with the amino group of another molecule in a condensation reaction.

FIG. 5A to 5D show four exemplary linkers that can be used for the nanostructure chemical self-assembly. These linkers can act analogously to magnets. Just as magnets have two distinct poles which only connect north to south, but not north to north or south to south, the linkers can attach at certain ends, and not others, and use these attachment points to connect nanoparticles.

Figure 5A:
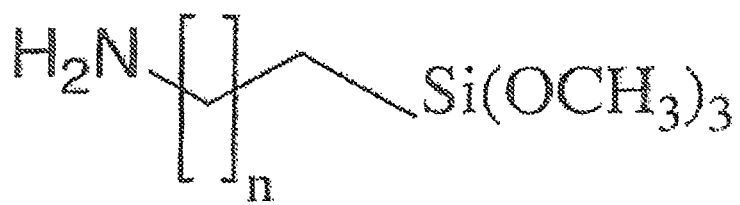
Figure 5B:
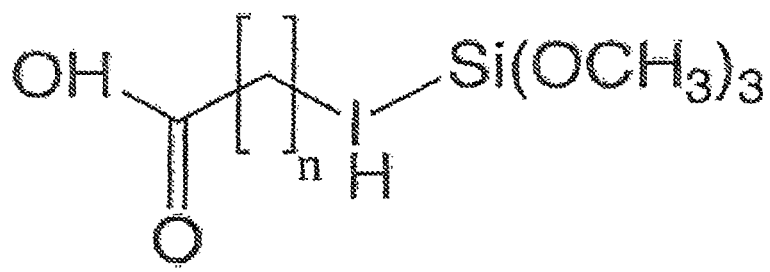
Figure 5C:
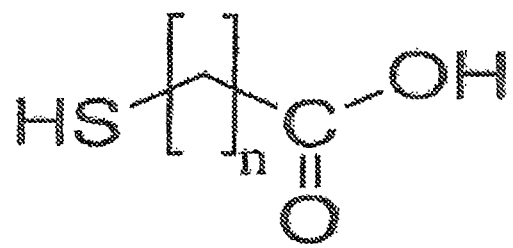
Figure 5D:
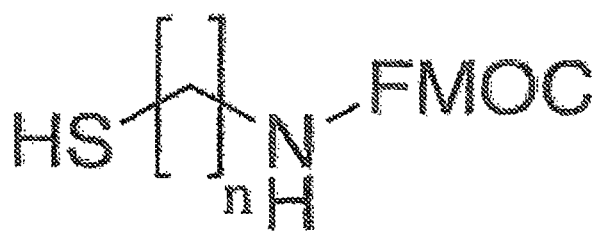

FIG. 5A shows an amino-silane linker which has an amine ($NH_2$) terminal group at one end and a trimethoxysilane ($Si(OCH_3)_3$) terminal group at the other end. FIG. 5B shows a silyl-carboxylic acid linker which has a trimethoxysilane terminal group at one end and a carboxylic acid (COOH) terminal group at the other end. FIG. 5C shows a carboxy-thiol linker which has a carboxylic acid terminal group at one end and a thiol (SH) group at the other end. The linker in FIG. 5D is an N-9-fluorenylmethoxymcarbonyl (Fmoc)-protected amino-thiol linker, which includes an Fmoc protecting group covering the amine terminal group. These are exemplary linkers for an exemplary self-assembly method, however, this method is not limited to using these types of linkers for assembling a nanostructure.

The four linkers can be chemically similar, providing a comprehensive synthesis plan for creating linkers that minimizes the total number of required precursors. Each of the four linkers can be created by starting with two chemical precursors. Various other precursors (e.g. a dicarboxylic acid or a carboxylic acid-alcohol) can be inserted into the process. For example, a $C_{20}$ dithiol can be used as a precursor rather than starting from a $C_{20}$ diol. Exemplary conversions that can be carried out during synthesis include: alcohol to thiol, carboxylic acid, primary amine, or alkene; and alkene to trimethoxysilane.

To ensure that the nanostructure is self-assembled efficiently and consistently, the linker attachments can be controlled by creating a protected surface on the gain medium nanoparticle. This can be accomplished by temporarily attaching the nanoparticle to a temporary host such as a polystyrene bead (PSB) or other neutral substrate. Another aspect of control can be achieved by using linkers with two different terminal functional groups, which form attachments to certain other terminal functional groups, but not others. These various linkers can be assembled with two kinds of exemplary chemical precursors. In addition, protection from protecting groups such as, for example, pyridine can be carried out to minimize expensive product loss. Tetrahydropyran (THP) can be used as the protecting group for the alcohol in light of its stability toward most chemical groups, especially nucleophiles. The following sections will describe in detail examples for the synthesis and characterization of the temporary host, precursors, and bi-functional linkers required to build the nanostructure.

Hydroxyl-PSB Synthetic Modification

An exemplary method for attaching a linker to the temporary host surface for binding to the gain medium nanoparticle can proceed as follows. Dry resin is added to an oven-dried flask, washed, and pre-swelled with dry, $O_2$ tree dimethylformamide. The linker is added in 5-molar equivalents excess and allowed to dissolve. Dichlorobenzoyl chloride (DBC) can then be added in 8-fold excess and the mixture is agitated for 18 hours. The modified resin is then washed, allowed to dry, and stored oxygen free.

Precursor A 1,12 Dodecanediol (100 ml, 0.57 mol) can be added to two molar equivalents of red phosphorus and 6 molar equivalents of iodine. This mixture is then heated to 130° C. and allowed to stir for 8-10 hours. After being decanted from unused solids, the diiodoalkane is then dissolved in dry dichloromethane (DCM) along with a 1.1 molar excess of sodium hydrogen sulfide and heated for 4 hours at reflux. After being decanted from unused solids, the DCM is removed via rotary evaporation. The disulfide can then be confirmed by $^1$H and $^{13}$C NMR.

To protect one end of the disulfide, tetrahydropyran (THP) is added in equal molar concentration along with catalytic acid in DCM and stirred at 35° C. overnight. The resulting mixture may then be chromatographed on silica. Dichloromethane can be used to wash the unbound di-THP while switching to acetone can remove the desired mono protected dithiol. 2 molar equivalents of red phosphorus and 6 molar equivalents of iodine are then added while heating the solution to 130° C. The reaction is stirred for 8-10 hours and then decanted. The iodated intermediate product, or precursor A, can be confirmed with $^1$H and $^{13}$C NMR and GCMS.

Precursor B 1,12 Dodecanediol (100 ml, 0.57 mol) can be added to an equal molar equivalent of THP along with catalytic acid in DCM and stirred at 35° C. overnight. The resulting mixture can then be chromatographed on silica. Dichloromethane can be used to wash the unbound di-THP from the column, while the addition of acetone can remove the desired mono-protected alcohol. The unprotected diol can then remain on the column. Solvent may be removed by rotary evaporation. The required intermediate product can be confirmed with $^1$H and $^{13}$C NMR and GCMS. The mono-protected diol can then be added to two molar equivalents of red phosphorus and 6 molar equivalents of iodine. This mixture is then heated to 130° C. and stirred for 8-10 hours. After decanting and filtering from unused solid reactants, the mono-protected alcohol ω-iodide, or precursor B, may be confirmed with $^1$H and $^{13}$C NMR and GCMS.

Ligand 1 Synthesis

Precursor B (0.1 mol) can be dissolved in ethanol and sparged with dry ammonia gas at 5 psi while stirring for 4-6 hours. The resulting amino halide salt is quenched with alcoholic potassium hydroxide. Acid can then be added to neutralize the solution, in slight excess for deprotection of the THP-alcohol. After decanting and filtration, the product is isolated via rotary evaporation. Two molar equivalents of red phosphorus and 6 molar equivalents of iodine are then added to the alcohol intermediate. This mixture is then heated to 130° C. and allowed to stir for 8-10 hours. After decanting and filtering from unused solid reactants, the mono-protected alcohol ω-amine will be treated with alcoholic potassium hydroxide. The resulting solution will be decanted and filtered for unused reactants, and the solvent can then be removed by rotary evaporation. The resultant intermediate may be dissolved in dry DCM and dried over magnesium sulfate. Once filtered, $HSi(OCH_3)_3$ will be added in enough excess to ensure total dryness. The product can be confirmed with $^1$H and $^{13}$C NMR, GCMS, and FT-IR.

Ligand 2 Synthesis

Precursor B (0.1 mol) can be solvated in ethanol and the resultant solution saturated with potassium hydroxide and stirred overnight. Solids are removed from the resulting solution by decanting/filtration and solvent removed by rotary evaporation. The intermediate product is then dissolved in dry hexanes and one equivalent of trimethoxysilane is added. Catalytic aqueous HCl is then added for deprotection of the alcohol. Silver carbonate in four molar excess can then be directly added and the solution is refluxed for 24 hours. Silver (I) oxide formed in situ by the addition of silver nitrate in excess sodium hydroxide can be added and then refluxed for a further 24 hours. After decanting and filtering from unused solid reactants, the ω-carboxyl methoxysilane can be re-crystallized from acetone/hexanes. Product may be confirmed with $^1$H and $^{13}$C NMR, GCMS, and FT-IR.

Ligand 3 Synthesis

Precursor A (0.1 mol) can be added to saturated alcoholic potassium hydroxide and vigorously vortexed for eight hours. Upon reaction completion, any solids can be filtered from the solution and solvent can be removed by rotary evaporation. The remaining product material can then be dissolved in 50/50 hexanes/henzene along with a four molar excess of silver carbonate on cellulite (Fétizon's reagent) and brought to reflux overnight. Solids are removed by filtration. Silver(I) oxide formed in situ by the addition of silver nitrate in excess sodium hydroxide and refluxed for a further 24 hours. When the silver(I) oxide is fully formed, the basic solution can be made acidic to facilitate removal of the tetrahydropyran (THP) protecting group. Excess sodium bicarbonate can be added to neutralize the solution. After decanting/filtration, the product can be isolated by rotary evaporation and can be characterized with $^1$H and $^{13}$C NMR, GCMS, and FT-IR.

Alternate synthesis from hydroxyl carboxylic acid is available in $C_{10}$, $C_{12}$, and $C_{16}$ chain lengths. Protection of the acid moiety can be accomplished via an oxazoline. The alcohol can then be converted to a thiol in two steps via $PI_3/Na^+SH^-$ as discussed above.

Ligand 4 Synthesis

Precursor A (0.1 mol) can be solvated in ethanol or a 50/50 mixture of methanol/dichloromethane (DCM) and then sparged with dry ammonia gas at 5 psi. The vessel can then be stirred for 4 to 6 hours. The resulting amino halide salt can be quenched with alcoholic potassium hydroxide. Acid can then added to neutralize the solution, with slight excess for deprotection of the thiol. The solution can then be filtered to remove any solids and isolated by rotary evaporation. The intermediate product can then be redissolved in DCM and mixed with excess Fmoc-hydroxysuccinimide. The resulting product can then be recrystallized from acetone/hexanes. The pure product can be confirmed with $^1$H and $^{13}$C NMR, GCMS, and FT-IR.

Overall Nanostructure Synthesis

A gain medium nanoparticle can be stabilized by protecting group linkers. For example, the core-shell nanoparticles synthesized as described above can be stabilized by, for example, trioctylphosphine oxide (TOPO) and hexadecylamine (HAD) ligands. These TOPO/HDA ligands can be ligand-exchanged with the organic linker ligands to permit assembly of the nanostructure. Initially, the TOPO/HDA ligands can be exchanged tor pyridine. The pyridine-stabilized core-shell nanoparticles can then be precipitated with methanol and collected via centrifugation. The new capping ligand of choice can then be added and stirred for several hours and then isolated by precipitating and collected via centrifugation.

To assemble the nanostructure, the temporary host, for example, carboxy-thiol modified PSBs can be mixed with the pyridine capped gain medium nanoparticles in dichloromethane (DCM) and allowed to complex for 12-36 hours. Binding of the nanoparticle to the temporary host can be monitored by absorption spectroscopy of the solution. Upon attachment of the nanoparticle to the PSB, these can be mixed with Fmoc-protected amino thiol linkers for 24 hours at 40° C. while agitating. The 'oriented' nanoparticles can then be cleaved from fee PSB resin by the addition of 95% trifluoroacetic acid (TFA) in DCM for one hour at room temperature To attach one output coupler nanoparticle to the 'oriented' nanoparticle prepared above, one equivalent of the aminosilane linker coated output coupler nanoparticles can be added and the system can be agitated for 24-48 hours. Once complexed, the amine groups on the output coupler nanoparticle can be coupled to the silyl carboxylic acid linker in the presence of five equivalents of dicyclohexylcarbodiimide (DCCI) or diisopropylcarbodiimide (DICI).

The resulting gain medium nanoparticle/output coupler nanoparticle pair can either be attached to a metal/metalloid oxide substrate or further self-assembled in solution. If a solution process may be desired, then the two-particle pair is precipitated from solution with methanol and centrifuged to isolate. To attach a first tier of $SiO_2$-coated metal nanoparticles, piperidine in DCM can be added, and the system can be agitated overnight. Six equivalents of carboxylic acid functionalized $SiO_2$-coated metal nanoparticles may then added to the gain medium nanoparticle/output coupler nanoparticle pair intermediate with six equivalents of either DCCI or DICI. The temperature is then raised from 0 to 20° C. over 2-4 hours. The resultant one-tier nanostructure can then be isolated by precipitation from methanol with centrifugation and then dispersed in fresh dry DCM.

To attach the second tier of $SiO_2$-coated metal nanoparticles, eight equivalents of amine-functionalized $SiO_2$-coated metal nanoparticles are added to the one tier nanostructure in the presence of eight equivalents of either DCCI or DICI. The temperature is then raised from 0 to 20° C. over 2-4 hours. The final nanostructure assembly can then precipitated with methanol, centrifuged, and dispersed in minimal anhydrous DCM to the required concentration. This solution can then be treated with excess trichloroacetyl chloride if required. The fully assembled device solution may then be added dropwise to oxide supports and the solvent can be allowed to evaporate, resulting in the fully assembled nanostructure anchored to an oxide support.

FIGS. 6A and 6B depict exemplary processes that create a protected surface on a gain medium nanoparticle. As shown in FIG. 6A, a gain medium nanoparticle 610 has binding sites capped with protecting group elements 620a to 620d. There is also provided a linker 630 which has terminal ends 650 and 660. Terminal end 660 is linked to a temporary host 640.

In an exemplary embodiment, in FIG. 6A, the gain medium nanoparticle 610 has binding sites capped with pyridine 620a through 620d, though other protecting groups could be used to cap the binding sites. There is provided an exemplary carboxylic acid thiol linker 630 which can attach to an exemplary polystyrene bead 640 at the carboxylic acid terminal group 650, although there may be other larger diameter substrates and other organic linkers used in other exemplary embodiments. As one of the pyridines 620 leaves, the thiol terminal group 660 of the attached linker can bind to the gain medium nanoparticle.

FIG. 6B shows a gain medium nanoparticle 610 with one of the protecting group elements 620d removed. The gain medium nanoparticle is linked to the linker 630 at the terminal end 660. Terminal end 650 attached to the temporary host 640.

In an exemplary embodiment, FIG. 6B shows the removed pyridine group and the gain medium nanoparticle 610 attached to the polysterene bead 640 via the carboxylic acid thiol linker 630. The gain medium nanoparticle is then removed from the substrate by detaching the carboxylic acid thiol linker from the polystyrene bead. By removing the gain medium nanoparticle from the polystyrene bead, an 'active' carboxylic acid terminal group can be exposed for connection to an amino silyl coated output coupler nanoparticle in a further step of the assembly process. In another step, the capping pyridines can be replaced with exemplary organic linkers Fmoc-protected amino thiols. In some embodiments of this invention, these linkers could be other types of organic linkers which have protected terminal groups.

FIGS. 7A and 7B depict exemplary processes that attaching a gain medium nanoparticle 710 to an output coupler nanoparticle 760. As shown in FIG. 7A, a gain medium nanoparticle 710 may be surrounded by protecting group elements 720a to 720c as well as a linker 730 which includes a first terminal group element 740 that attaches to the gain medium nanoparticle 710 and has another terminal group element 750. There is also shown an output coupler nanoparticle 760 which may be surrounded by linkers 775a to 775d. These linkers have first terminal elements 770a to 770d that attach to the output coupler nanoparticle 760 and have second terminal elements 780a to 780d.

In an exemplary embodiment, FIG. 7A includes a gain medium nanoparticle 710 surrounded by Fmoc-protected amino thiols 720a to 720c and a carboxylic acid thiol linker 730 which attaches to the gain medium nanoparticle to at a thiol (SH) group 740 and has an 'active' carboxylic acid (COOH) terminal group 750. FIG. 7A also shows an exemplary output coupler nanoparticle 760 surrounded by amino silyl linkers which attach to the output coupler nanoparticle 760 at a silane ($SiH_4$) functional group 770a to 770d and has an amino ($NH_3$) terminal functional group 780a to 780d, any one of which can bind to the carboxylic acid terminal group 750.

In FIG. 7B the gain medium nanoparticle and the output coupler nanoparticle are able to be linked together at a connection point 790. In an exemplary embodiment, FIG. 7B shows the nitrogen of the amino group 780b, for example, and the doubly bonded oxygen of the carboxylic acid group 750 having rearranged to form an amide group 790, effectively connecting the gain medium nanoparticle 710 and the output coupler nanoparticle 750. This can permit the linkers to connect by peptide bonding, similar to the bonding mechanism of amino acids, where the amine functional groups can, for example, bond to the carboxylic acid functional groups. After these two nanoparticles have been connected, the Fmoc protecting groups on the Fmoc-protected amino thiols 720a to 720c may be removed to expose an 'active' amine group for each of these linkers.

FIGS. 8A and 8B show the steps of assembling a tier of metal nanoparticles to surround a gain medium nanoparticle. For example, FIG. 8A shows a gain medium nanoparticle 810 attached to an output coupler nanoparticle at connection point 815. This connection is detailed above in FIGS. 7A and 7B. FIG. 8A also shows the gain medium nanoparticle 810 surrounded by linkers including a first terminal group 820a to 820c attached to the gain medium nanoparticle as well as a second terminal group 830a to 830c. There is also shown a metal nanoparticle 840 surrounded by linkers that include a first terminal group 850a to 850c and a second terminal group 860a to 860c. Any one of the terminal groups 830a to 830c has the ability to connect to any one of the terminal groups 860a to 860c. In FIG. 8B, a connection point 870 is shown which connects the gain medium nanoparticle 810 to the metal nanoparticle 840.

In an exemplary embodiment, in FIG. 8A, a gain medium nanoparticle 810 is surrounded by amino thiol linkers, which attach to the gain medium nanoparticle 810 at thiol groups 820a to 820c. These linkers have amino ($NH_3$) terminal groups 830a to 830c. FIG. 8A also shows exemplary metal nanoparticle 840 surrounded by carboxy silyl linkers which attach to the metal nanoparticle at silane ($SiH_4$) functional groups 850a to 850d and has carboxylic acid (COOH) terminal functional groups 860a to 860d, any one of which will preferably bind to any one of the amino groups 830a to 830c. This is shown in FIG. 8B where the gain medium nanoparticle 810 and the metal nanoparticle where the nitrogen of the amino group 830b, for example, and the doubly bonded oxygen of the carboxylic acid group 860b, for example, have rearranged to form an amide group 870, effectively connecting the gain medium nanoparticle 810 and the metal nanoparticle 840 via a peptide bond.

Injection into the nanostructure can be achieved through charge conducting organic linker ligands. These linkers can act as molecular "wires," linking the nanostructure to the electrodes of an exemplary injection structure and serving as charge-transfer linkers for the excitons. These wires work by tunneling electrons in and out of the nanostructure, thus providing carriers and current. FIG. 9 shows the nanostructure 910 bonded to metal electrodes 930a and 930b via charge conducting linkers 940a and 940b. Light impinging on the gain medium nanoparticle will generate electron-hole pairs (excitons) which can be transported through the charge-conducting linkers, enabling current to flow. The electrodes 930a and 930b may comprise, for example, indium tin oxide (ITO), or another transparent conductive oxide such as zinc dirhodium tetraoxide ($ZnR_2O_4$), niobium dioxyfluoride ($NbO_2F$) or monoclinic gallium oxide ($\beta$-$GaO_3$) or other transparent metals. Electrode material also may comprise one or more thin metal layers such as aluminum (Al), copper (Cu), titanium (Ti), etc. Injection into the nanostructure can be accomplished by using charge conducting linkers 940a and 940b. The conductive linkers may comprise organic charge conducting linker material such as phenylacetylene, polyaniline, polypyrrole and the like, for example, or other suitable materials, all of which may be synthesized according to known methods.

Final attachment to an optically transparent surface can be carried out by using unused linkers on the surface of the output coupler nanoparticle after at least one tier of metal nanoparticles has been added to the nanostructure. This can serve to provide orientation and anchoring for the nanostructure to an exemplary substrate or housing medium. For example, thermal oxide can bind to the output coupler nanoparticle to serve as a substrate for the nanostructure.

FIG. 10 shows an exemplary nanostructure with a gain medium nanoparticle 1010 and one tier of metal nanoparticles 1020a through 1020c arranged around the gain medium nanoparticle 1010 connected with a first kind of linker 1015a through 1015c, as well as an output coupler nanoparticle 1030, with a second kind of linker 1035 connecting the nanostructure to an exemplary substrate 1040. This substrate may be thermal oxide or any other substrate that will serve to anchor the nanostructure.

Because of the unique optical properties that can result from the interactions between the gain medium and the feedback structure, and the three-dimensional confinement these nanostructure assemblies are able to achieve, there is great potential for novel applications for these structures. Unlike a two-dimensional surface where a field can involve a certain polarization, where light entry can be limited to a certain direction, and where the amount of field inside can depend strongly on the direction (e.g., nanorods and nanowires that confine light only in two dimensions), the three-dimensional (3-D) aspect disclosed herein is substantially directionally independent. The 3-D structures described herein can confine light propagating from almost any direction, resulting in a capacity for a greatly enhanced localized electric field.

For example, the enhanced electric field created by a superstructure arranged around some light-emitting nanoparticle such as a quantum dot or other gain medium nanoparticle can be used to stimulate an increase in emission from that light-emitting nanoparticle. The 3-D super-structure can alternatively be arranged around a non-linear material, a magnetic material or even a molecule of heavy water, for the purpose of confining light and focusing the electromagnetic energy from all directions into localized spot. Additionally, while 3-D confinement is present in certain existing applications such as photonic band gap crystals, these crystals can include many defects, and their growth and resulting form can be difficult to control. To generate enhancement, the crystals are thousands of layers thick. As described herein, a means of generating 3-D confinement can be achieved using several layers of nanoparticles.

It will be apparent to those skilled in the art that various changes and modifications can be made in the method and system for accumulating and presenting device capability information of the present invention without departing from the spirit and scope thereof. Thus, it is intended that the invention cover the modifications of this invention provided they come within the scope of the appended claims and their equivalents.

What is claimed is:

1. A nanostructure comprising:
a gain medium nanoparticle;
an output coupler nanoparticle being discrete from and linked to the gain medium nanoparticle; and
a plurality of metal nanoparticles being linked about the gain medium nanoparticle,
wherein the gain medium nanoparticle and the output coupler nanoparticle are included in the nanostructure in a one to one ratio.

2. The nanostructure according to claim 1, comprising:
a first linker attached to the gain medium nanoparticle;
a plurality of second linkers attached to the gain medium nanoparticle;
a plurality of third linkers attached to the output coupler nanoparticle; and
a plurality of fourth linkers attached to a plurality of metal nanoparticles.

3. The nanostructure according to claim 1, wherein the output coupler nanoparticle is a silicon dioxide nanoparticle.

4. The nanostructure according to claim 1, wherein the gain medium nanoparticles are CdSe, GaAs, InSb, or $LiNbO_3$.

5. The nanostructure according to claim 1, wherein the metal nanoparticles are gold, silver, aluminum, copper, titanium, or chromium.

6. The nanostructure according to claim 2, wherein the first linker attaches to one of the third linkers at a connection point.

7. The nanostructure according to claim 2, wherein each of the second linkers attach to a corresponding one of the fourth linkers so as to link the plurality of metal nanoparticles to the gain medium nanoparticle.

8. The nanostructure according to claim 1, wherein the metal nanoparticles are coated with a material having a different dielectric constant than the metal nanopartieles.

9. The nanostructure according claim 5, wherein the metal nanonarticles shift the resonant wavelength of the nanostructure.

10. The nanostructure according to claim 1, wherein a second plurality of metal nanoparticles is arranged around and linked, to the first plurality of metal nanoparticles.

11. The nanostructure according to claim 10, wherein the size of the first plurality of metal nanoparticles is different from the size of the second plurality of metal nanparticles.

12. The nanostructure according to claim 3, wherein the gain medium nanoparticle comprises a heterostructure.

13. The nanostructure according to claim 1, wherein the first plurality of metal nanoparticles is linked about the gain medium nanoparticle in a concentric arrangement.

14. The nanostructure according to claim 1, wherein the nanostructure is attached to a substrate.

15. The nanostructure according to claim 2 wherein one or more of the first linker, the plurality of second linkers, the plurality of third linkers, and the plurality of fourth linkers are alkane linkers.

16. The nanostructure according to claim 2 one or more of the first linker, the plurality of second liners, the plurality of third linkers, and the plurality of fourth linkers are polyethylene glycol (PEG) linkers.

17. A nanostructure consisting of:
one gain medium nanostructure;
a first linker attached to the gain medium nanoparticle;
a plurality of second linkers attached to the gain medium nanoparticle;
one output coupler nanoparticle;
a plurality of third linkers attached to the output coupler nanoparticle;
a plurality of metal nanoparticles; and
plurality of fourth linkers, each of the plurality of fourth linkers being attached to one of the plurality of metal nanoparticles,
wherein the first linker attaches to one of the third linkers at a connection point such that the output coupler nanoparticle is linked to the gain medium nanoparticle,
wherein each of the second linkers attach to one of the fourth linkers such that the plurality of metal nanoparticles are linked about the gain medium nanoparticle, and wherein the nanostructure is optionally attached to a substrate.

18. A method or assembling a nanostructure, comprising:
attaching a first linker to a gain medium nanoparticle;
attaching the first linker to a substrate larger than the gain medium nanoparticle;
attaching a plurality of second linkers to the gain medium nanoparticle;
detaching the first linker connected to the gain medium nanoparticle from the substrate;
attaching a plurality of third linkers to an output coupler nanoparticle;
attaching the first linker to one of the plurality of third linkers, such that the output coupler nanoparticle is discrete flora and linked to the in medium nanoparticle;
attaching a plurality of fourth linkers to a plurality of metal nanoparticles; and
attaching each of the plurality of second linkers to each of the plurality of fourth linkers,
wherein the gain medium nanoparticle and the output coupler nanoparticle are included in the nanostructure in a one to one ratio.

19. The method of claim 18 wherein the first linkers are amino-silane ligands.

20. The method of claim 18 wherein the second linkers are silyl-carboxylic acid ligands.

21. The method of claim 18 wherein the third linkers are carboxylic acid-thiol ligands.

22. The method of claim 18 wherein the fourth bakers are FMOC-protected amino-thiol ligands.

23. The method of claim 18, wherein the output coupler nanoparticle has a size ranging from about 10 nanometers to about 350 nanometers.

24. The method of claim 18, wherein the output coupler nanoparticle and the gain medium nanoparticle are linked together at a connection point.

* * * * *